(12) United States Patent
Lee

(10) Patent No.: US 8,759,892 B2
(45) Date of Patent: Jun. 24, 2014

(54) SEMICONDUCTOR DEVICE INCLUDING VERTICAL TRANSISTOR AND METHOD FOR MANUFACTURING THE SAME

(71) Applicant: SK hynix Inc., Icheon-si (KR)

(72) Inventor: Kyoung Han Lee, Icheon (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 13/745,357

(22) Filed: Jan. 18, 2013

(65) Prior Publication Data

US 2013/0126964 A1 May 23, 2013

Related U.S. Application Data

(63) Continuation-in-part of application No. 12/976,792, filed on Dec. 22, 2010, now Pat. No. 8,383,477.

(30) Foreign Application Priority Data

Jul. 13, 2010 (KR) .......................... 10-2010-0067333

(51) Int. Cl.
*H01L 29/78* (2006.01)

(52) U.S. Cl.
USPC ............................ 257/306; 257/330; 257/332

(58) Field of Classification Search
USPC ................... 257/295–335, E29.183
See application file for complete search history.

(56) References Cited

U.S. PATENT DOCUMENTS 8,120,103 B2 * 2/2012 Hong ............................ 257/331

* cited by examiner

*Primary Examiner* — Cuong Q Nguyen

(57) ABSTRACT

A semiconductor device including a vertical transistor and a method for forming the same are disclosed, which can greatly reduce a cell area as compared to a conventional layout of 8F2 and 6F2, and need not form a bit line contact, a storage node contact, or a land plug, such that the number of fabrication steps is reduced and a contact region between the bit line and the active region is increased in size. The semiconductor device including a vertical transistor includes an active region formed over a semiconductor substrate, a first recess formed to have a predetermined depth at both sides of the active region, and a bit line buried in the first recess.

10 Claims, 22 Drawing Sheets

SEMICONDUCTOR DEVICE INCLUDING VERTICAL TRANSISTOR AND METHOD FOR MANUFACTURING THE SAME

CROSS-REFERENCE TO RELATED APPLICATIONS

This application is a continuation-in-part under 35 U.S.C. §120 of U.S. patent application Ser. No. 12/976,792, filed Dec. 22, 2010 claiming of the priority of Korean Patent Application No. 10-2010-0067333, filed on Jul. 13, 2010. The entire content of each of the above-referenced patent applications is hereby incorporated by reference herein.

BACKGROUND OF THE INVENTION

Embodiments of the present invention relate to a semiconductor device and a method for forming the same, and more particularly to a semiconductor device including a vertical transistor, and a method for forming the same.

A semiconductor memory device includes a plurality of unit cells each having a capacitor and a transistor. The capacitor is used to temporarily store data, and the transistor is used to transfer data between a bit line and the capacitor in response to a control signal (word line). The transistor has three regions, i.e., a gate, a source, and a drain. Electric charges move between the source and the drain according to a control signal inputted to the gate of the transistor. The movement of the electric charges between the source and the drain is achieved through a channel region.

When a typical transistor is formed over a semiconductor substrate, a stack-type gate is formed on the semiconductor substrate, and impurities are doped at both sides of the gate to form a source and a drain. In this case, a region between the source and the drain under the gate becomes a channel region of the transistor. The transistor including the horizontal channel region occupies a large-sized area of the semiconductor substrate. Accordingly, it is difficult to reduce the overall area of a complicated semiconductor device since semiconductor device includes a plurality of transistors.

A variety of methods have been proposed to reduce the overall area of the semiconductor device. A representative method uses a vertical transistor including a vertical channel region instead of a conventional planar transistor including a horizontal channel region.

BRIEF SUMMARY OF THE INVENTION

Various embodiments of the present invention are directed to providing a semiconductor device including a vertical transistor and a method for forming the same that substantially obviate one or more problems due to limitations and disadvantages of the related art.

An embodiment of the present invention relates to a method for forming a semiconductor device to reduce a cell area by improving a structure of the semiconductor device, resulting in simplified fabrication process.

An embodiment of the present invention relates to a method for forming a semiconductor device to obtain a drive current by increasing a contact region between a bit line and an active region.

In accordance with an aspect of the present invention, a semiconductor device including a vertical transistor includes: an active pillar vertically protruded from a semiconductor substrate; a first recess formed at both sidewalls of a lower portion of the active pillar; and a bit line buried in the first recess.

The semiconductor device may further include a second recess formed over the first recess in the active pillar; and a word line formed to cross the bit line, and buried in the second recess.

In accordance with another aspect of the present invention, a method for forming a semiconductor device includes: forming an active pillar over a semiconductor substrate; forming a first recess at both sidewalls of the active pillar; and forming a bit line to be buried in the first recess.

The method may further include: after forming the bit line, forming a second recess over the first recess in the active pillar; and forming a word line to be buried in a second recess.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts. A semiconductor device including a vertical transistor and a method for forming the same according to an embodiment of the present invention will hereinafter be described with reference to the attached drawings.

Figure 1:
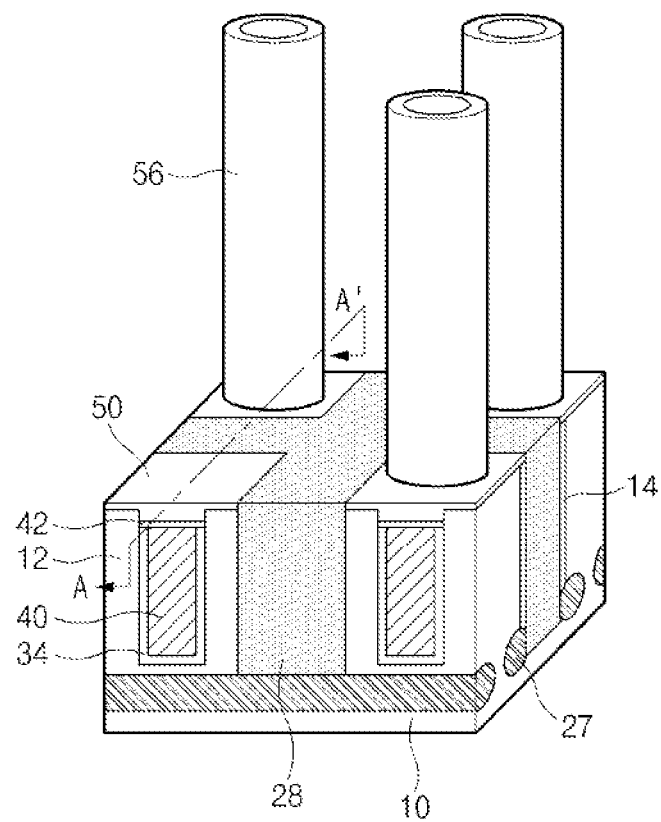
FIGS. 1 and 2 are perspective views illustrating a semiconductor device including a vertical transistor according to an embodiment of the present invention.
Figure 2:
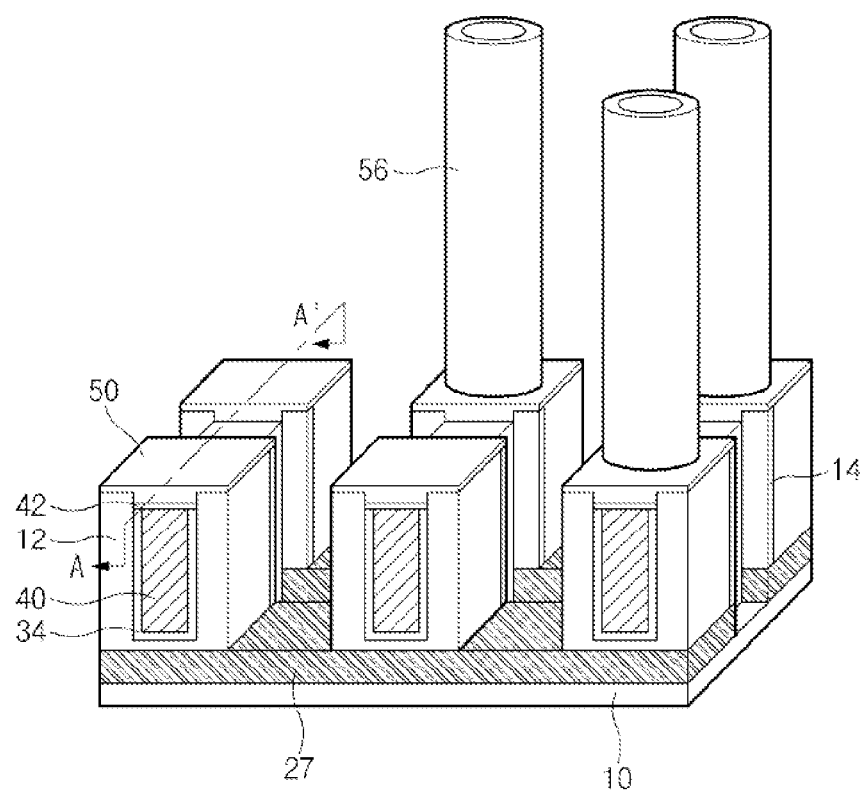

FIGS. 1 and 2 are perspective views illustrating a semiconductor device including a vertical transistor according to an embodiment of the present invention. FIG. 1 shows a line-type structure in which a bit line 27 is buried in both sidewalls of a lower portion of an active region (active pillar) 12 in such a manner that the bit line 27 is extended to a first direction. FIG. 2 shows a surrounding-type structure in which the bit line 27 encloses four sides of a lower portion of the active region 12, and is extended to a first direction.

The semiconductor device includes a plurality of active regions 12 vertically protruded from a substrate 10, each active region 12 being isolated by an insulation film 28. A word line 40 is extended to a second direction perpendicular to the first direction, and is formed to penetrate the plurality of active regions 12 or is buried in the active regions 12. A protective film (also called a word line insulation film) 34 is formed at a surface where the word line 40 is in contact with the active region 12. The protective film 34 includes an oxide film. A lower storage node 50 is formed over the word line 40 within each active region 12, and an upper storage node 56 is formed over the lower storage node 50. A bit line 27 extended perpendicular to the word line 40 is formed at both sides of a lower portion of each active region 12.

The semiconductor device shown in FIG. 2 encloses a lower portion of the active region 12 and is extended perpendicular to the word line 40, differently from the semiconductor device of FIG. 1, but the remaining parts other than the above different parts in FIG. 2 are identical to those of FIG. 1.

The semiconductor device according to an embodiment of the present invention is formed as a first structure via which the word line 40 is buried in the active region 12, or is formed as a second structure via which the word line 40 passes through the active region 12, such that the cell area is reduced in size and parasitic capacitance between the word line 40 and the bit line 27 is also reduced.

In addition, a contact region between the bit line 27 and the active region 12 can be increased in size. In accordance with the embodiment of FIG. 1, the bit line 27 is in contact with two sides of the active region 12. In accordance with the embodiment of FIG. 2, the bit line 27 is in contact with four sides of the active region 12. Therefore, resistance between the bit line 27 and the active region 12 is reduced so that a drive current of the bit line 27 is increased.

Moreover, the bit line 27 is not formed at an outer lateral surface of the active region 12, and is buried in a bulb-type recess contained in the active region 12, such that parasitic capacitance generated between neighbor bit lines 27 can be reduced and a fabrication margin in bit-line formation can be guaranteed.

Figure 3A:
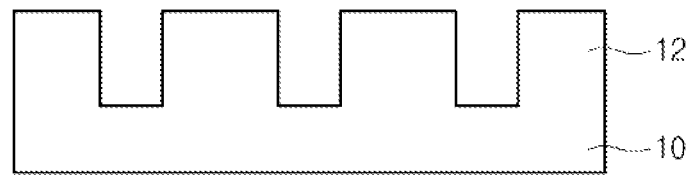
FIGS. 3a to 3p are cross-sectional views illustrating a semiconductor device including a vertical transistor according to an embodiment of the present invention.
Figure 3B:
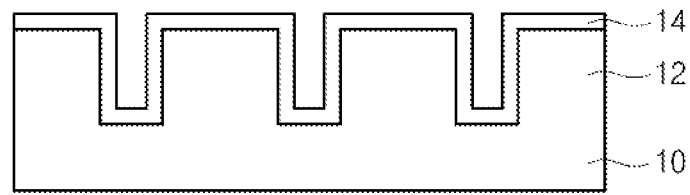
Figure 3C:
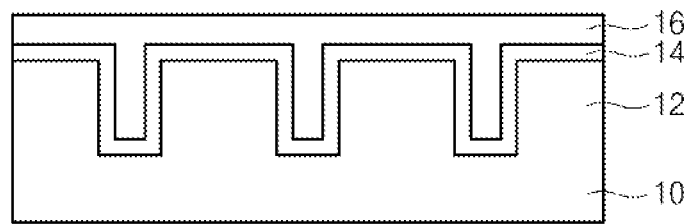
Figure 3D:
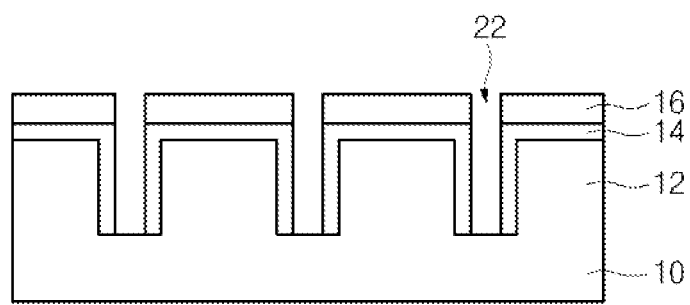
Figure 3E:
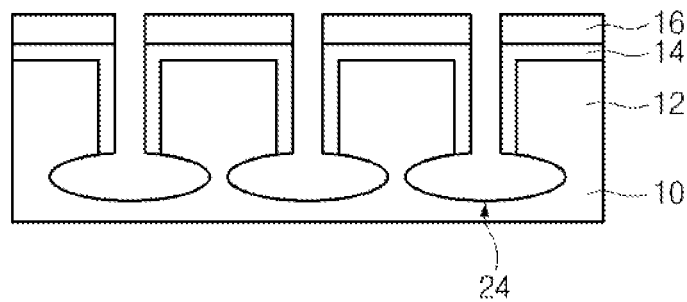
Figure 3F:
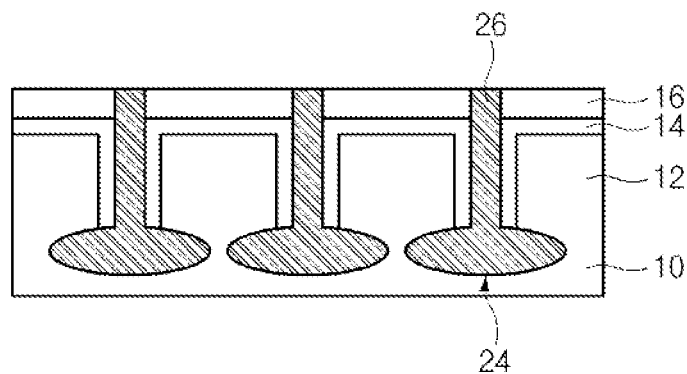
Figure 3G:
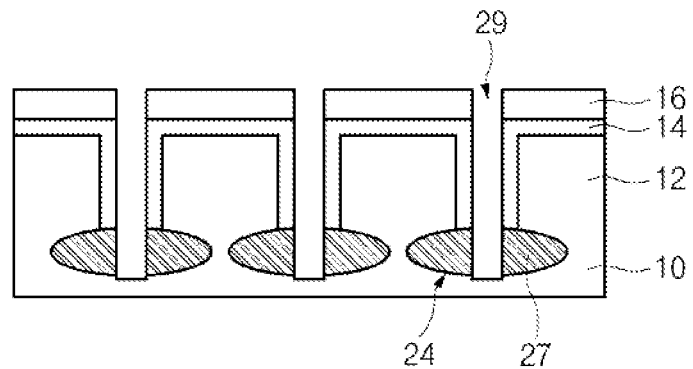
Figure 3H:
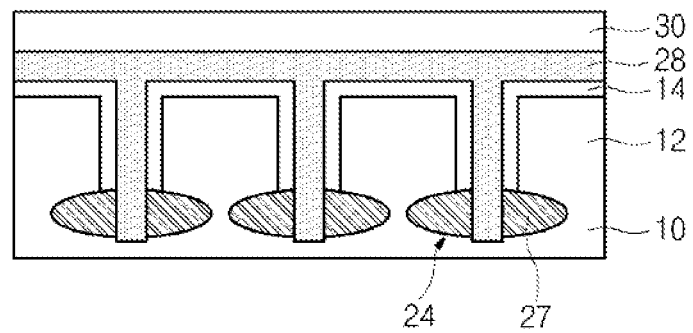
Figure 3I:
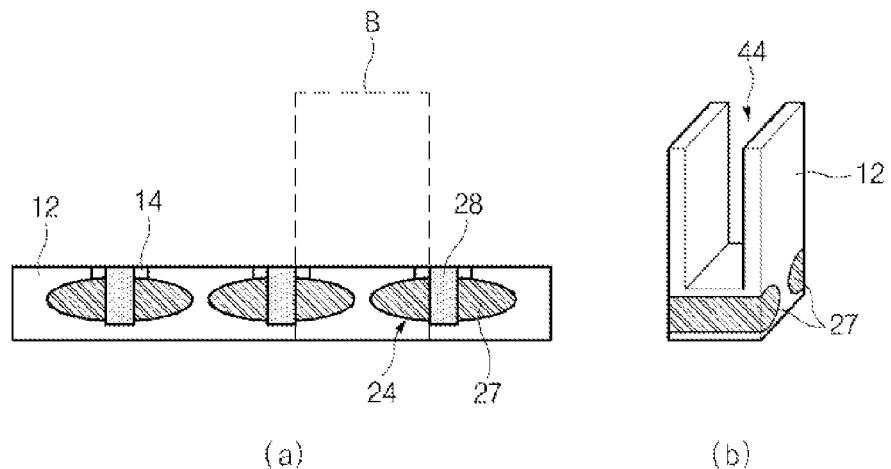
Figure 3J:
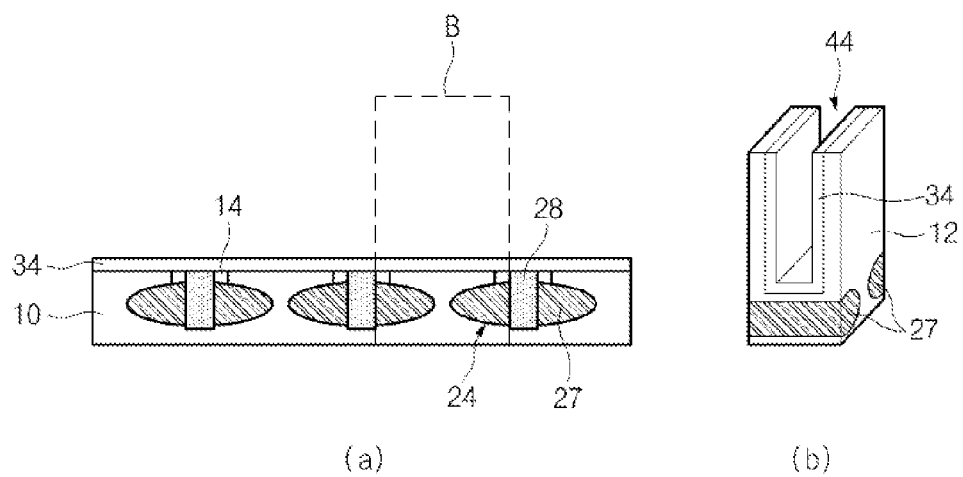
Figure 3K:
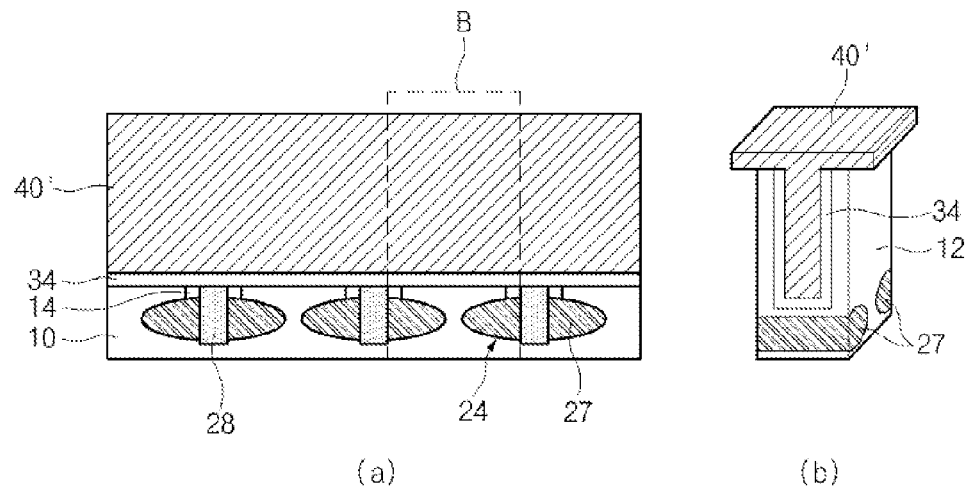
Figure 3L:
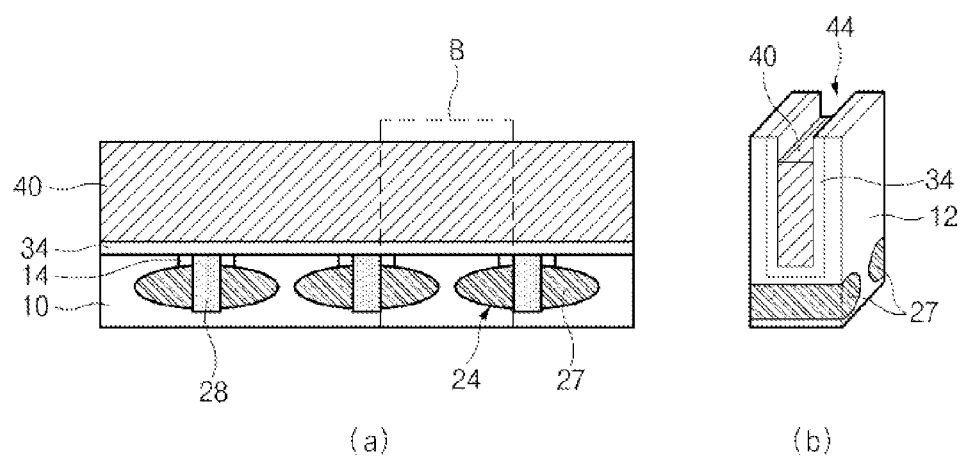
Figure 3M:
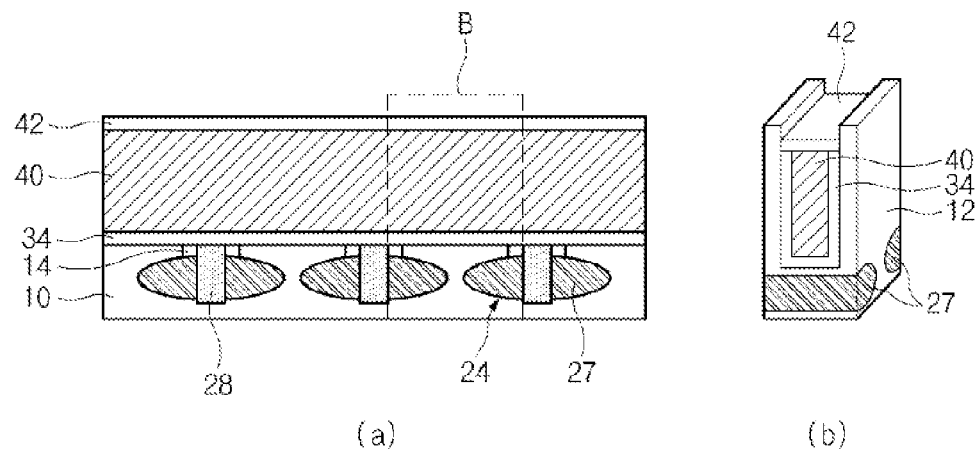
Figure 3N:
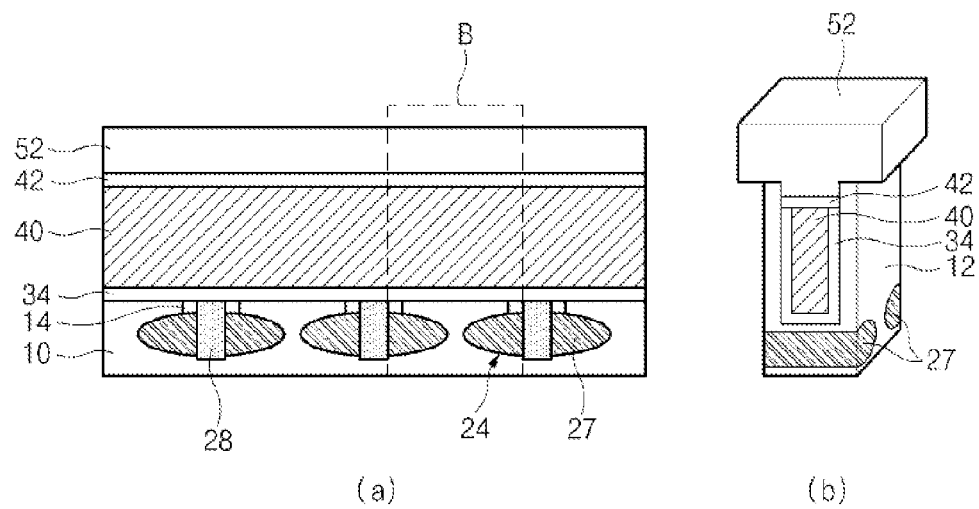
Figure 3O:
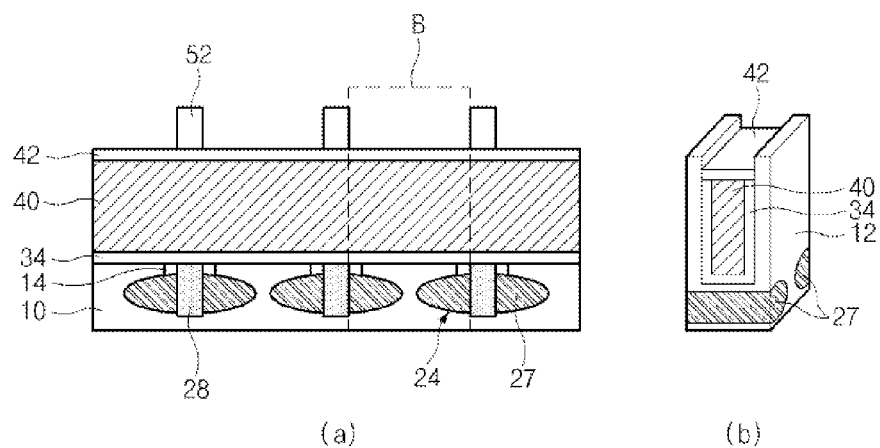
Figure 3P:
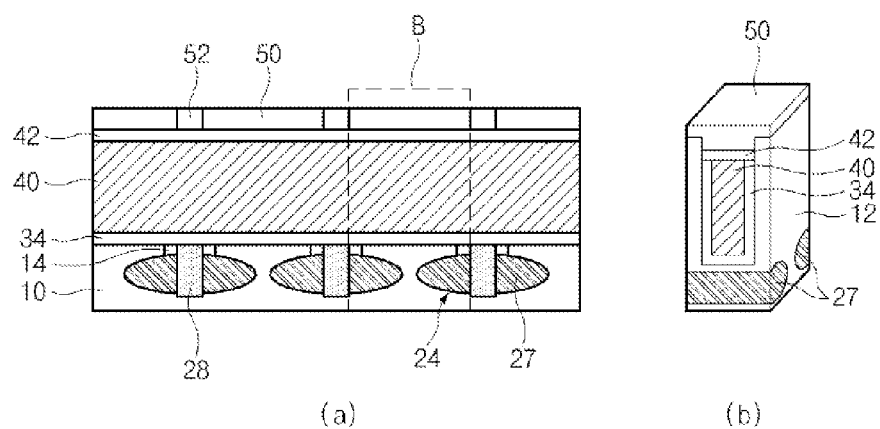

FIGS. 3a to 3p are cross-sectional views illustrating a semiconductor device including a vertical transistor, taken along the line A-A' according to an embodiment of the present invention. FIGS. 3a to 3p are cross-sectional views illustrating the semiconductor device of FIGS. 1 and 2.

Referring to FIG. 3a, an active region 12 is formed by etching a semiconductor substrate 10. In order to form the active region 12, a mask (not shown) defining an island-type active region is formed over the semiconductor substrate 10, and the semiconductor substrate 10 is etched using the mask as an etch mask, resulting in formation of the active region 12. Alternatively, a line-type mask arranged along a first direction is formed over the semiconductor substrate 10, and the semiconductor substrate 10 is primarily etched using the line-type mask. After a line-type mask arranged in a second direction perpendicular to the first direction is formed over the substrate 10, the primarily etched semiconductor substrate 10 is secondarily etched using the line-type mask, resulting in formation of the active region 12.

Referring to FIG. 3b, a protective film 14 is formed over the semiconductor substrate 10 including the active region 12. The protective film 14 may include an insulation material such as an oxide film, and may be formed by Physical Vapor Deposition (PVD).

Referring to FIG. 3c, an insulation film 16 is formed over the protective film 14 in a manner that all spaces between the active regions 12 are buried to cover the active region 12, and is then planarized. The insulation film 16 is formed of a material for protecting the active region from a subsequent etching process, and includes an oxide film or a nitride film.

Referring to FIG. 3d, the insulation film 16 between the neighbor active regions 12 arranged in a second direction is etched, so that a line-type recess 22 is formed. The recess 22 is configured to form a bit line in a subsequent process. In the etching process for forming the recess 22, the semiconductor substrate 10 is used as an etch target, and the etching range may be extended to the protective film 14 formed below the recess 22.

Referring to FIG. 3e, a bulb-type recess 24 is formed below the recess 22 by etching a lower portion of the recess 22. Preferably, the etching process may be a wet-etching process. The protective film 14 formed at a sidewall of the recess 22 may prevent a sidewall of the active region 12 from being etched.

Referring to FIG. 3f, after a conductive material 26 is formed to bury the recesses (22, 24), the conductive material 26 is etched to expose the insulation film 16 such that it is planarized. In this case, the conductive material 26 serving as a material for forming the bit line may include a metal material such as tungsten (W) or a doped polysilicon.

Referring to FIG. 3g, the conductive material 26 is etched until the semiconductor substrate 10 is exposed using the mask used for forming the recess 22, resulting in formation of a recess 29. As a result, the conductive material 26 buried in the bulb-type recess 25 is isolated so that a bit line 27 is formed below the active region 12. In the etching process for forming the recess 29, the conductive material 26 is isolated and at the same time neighbor active regions 12 are also isolated from one another.

Referring to FIG. 3h, an insulation film 28 is formed to bury the recess 29 so that the isolated bit lines 27 are isolated from one another. Therefore, the bit lines 27 are symmetrically formed at both sides of a lower portion of the active region 12. In this case, the insulation film 28 may be formed of the same material as the insulation film 16. For convenience of description and better understanding of the present invention, two insulation films 16 and 28 formed of the same material are denoted by the same reference numeral 28.

Subsequently, a word-line formation mask 30 defining a word-line region is formed over the insulation film 28.

Referring to FIG. 3i, the active region 12, the protective film 14 and the insulation film 28 are etched using the word-line formation mask 30 as an etch mask, such that a word-line recess 44 is formed. In this case, the word-line recess 44 is formed to pass through the center part of the active region 12 as shown in FIG. 3i (b). As a result, a space 44 via which the word line is buried in the active region 12 is formed in a subsequent process.

For convenience of description, FIG. 3i (b) is a perspective view illustrating a region denoted by B of FIG. 3i (a). In each of FIGS. 3j to 3p, (a) and (b) are respectively a cross-sectional view and a perspective view of the semiconductor device in the same manner as in (a) and (b) of FIG. 3i.

Referring to FIG. 3j, a second protective film 34 is formed in the word line recess 44. The second protective film 34 may include an oxide film, such that it is used as a gate insulation film through which a word line (See '40' of FIG. 3l) to be formed in a subsequent process is not in direct contact with the active region 12.

Referring to FIG. 3k, a word line material 40' is formed over the second protective film 34 to fill the word line recess 44. The word line material 40' may include a metal material such as tungsten (W) or titanium (Ti) or a conductive material such as polysilicon in the same manner as in the bit line 27.

Referring to FIG. 3l, the word line material 40' formed over the active region 12 is removed through an etch-back process or Chemical Mechanical Polishing (CMP) process, such that a plurality of isolated word lines 40 are formed. In this case, a top surface of the word line 40 may be lower in height than a top surface of the active region 12 as shown in FIG. 3*l*.

Referring to FIG. 3*m*, a word line insulation film 42 formed of an insulation film such as an oxide film is formed over the word line 40, such that it isolates the word line 40 from an external part.

Referring to FIG. 3*h*, a storage node insulation film 52 is formed over the word line insulation film 42 and the second protective film 34.

Referring to FIG. 3*o*, a predetermined region in which a lower electrode 50 (See FIG. 3*p*) from among the storage node insulation films 52 is to be formed in a subsequent process is etched. In the etching process, the storage node insulation film 52 is etched until the word line insulation film 42 is exposed.

Referring to FIG. 3*p*, a lower electrode 50 (for convenience, only a bottom surface of the lower electrode is shown) is formed in a region from which the storage node insulation film 52 is etched, and a dielectric film and an upper electrode (not shown) are formed over the lower electrode 50, such that a capacitor 56 shown in FIGS. 1 and 2 is finally formed. In this case, the capacitor 56 may be in various kinds of structures such as a concave type, a cylinder type and a pillar type.

By the above-described method shown in FIGS. 3*a* to 3*p*, the semiconductor device including a vertical transistor shown in FIGS. 1 and 2 can be formed.

FIGS. 4 to 8 are perspective views illustrating a semiconductor device including a vertical transistor according to an embodiment of the present invention.

Figure 4:
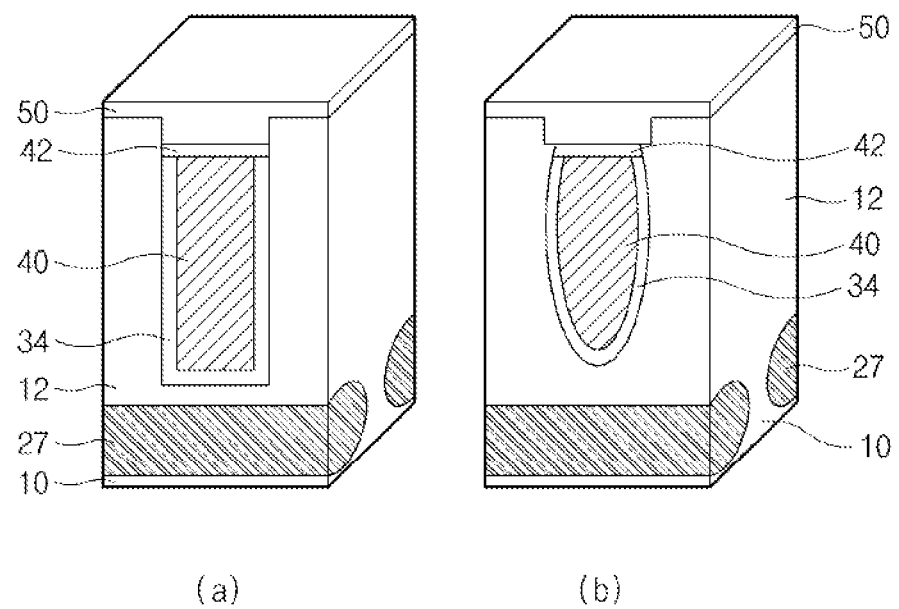
FIGS. 4 to 8 are perspective views illustrating a semiconductor device including a vertical transistor according to an embodiment of the present invention.
Figure 5:
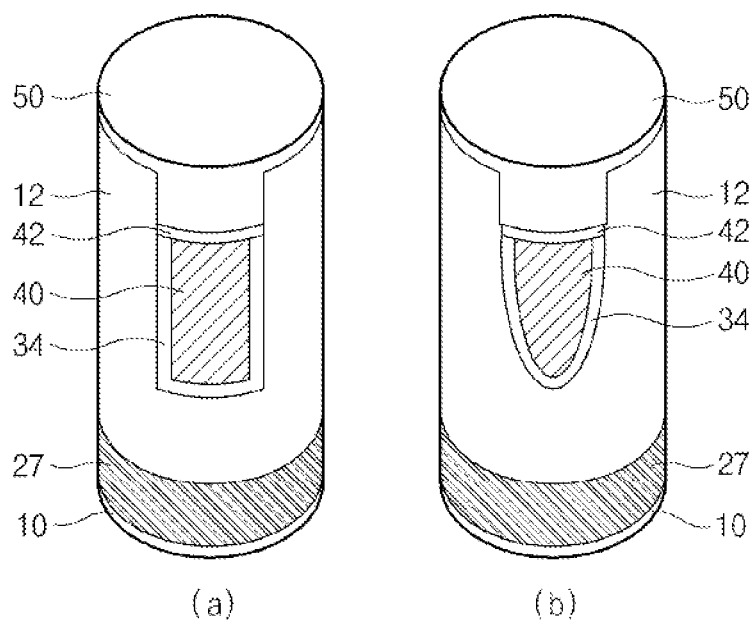

Referring to FIG. 5(*b*) of FIG. 4 (the embodiment shown in (*a*) of FIG. 4 is identical to what shown in FIG. 1), the cross-sectional view of the word line 40 buried in the active region 12 may not always be in a rectangular or may also in an oval form. It is easier to form a word line recess where the word line 40 is filled in (See FIG. 3*k*) in an oval shape as shown in FIG. 4(*b*) rather than in a rectangular shape as shown in FIG. 4(*a*).

Referring to FIG. 5, the active region 12 may not always be in a rectangular pillar shape or may also be in a cylindrical column shape. When the active region 12 is formed in a cylindrical column shape, it is easier to etch the substrate 10 (see FIG. 3*a*) in order to obtain the active region 12. As shown in (*b*) of FIG. 5, the active region 12 may be formed to have a cylindrical column shape, and the cross-sectional shape of the word line 40 may be formed to be oval.

Figure 6:
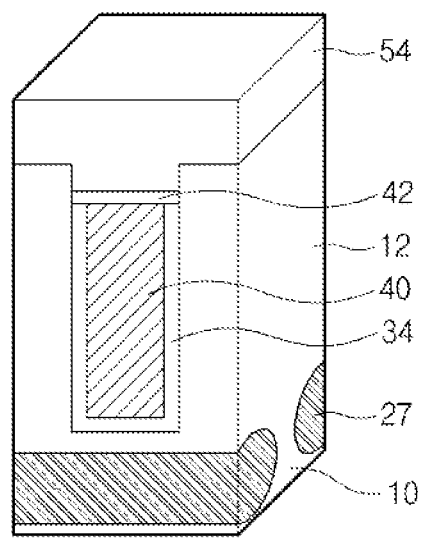

Referring to FIG. 6, it is possible to form a storage node contact 54 over the active region 12 and the word line 40. In the embodiment illustrated in FIGS. 1 and 2, the lower electrode 50 of the capacitor is formed over the word line 40 and the word line insulation film 42. However, if necessary, the cell operation is not affected even when the storage node contact 54 is formed in such a shape as shown in FIG. 6. The storage node contact 54 may include a conductive material such as polysilicon or a metal film.

Figure 7:
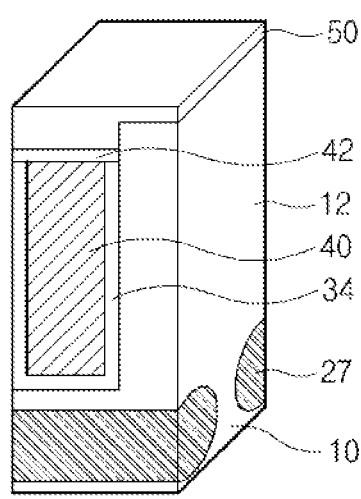

Referring to the embodiments illustrated in FIGS. 1 and 2, the word line 40 is buried in the middle part of the active region 12 in order to form a channel in the active region 12 along the left and right sidewall of the word line. In other embodiments, the word line 40 may be formed as shown in FIG. 7 so that a channel is formed along the one sidewall only of the word line 40, thereby making the transistor properly operable.

Figure 8:
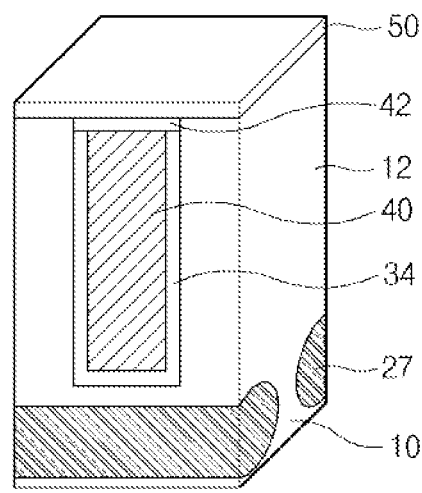

In the embodiments illustrated in FIGS. 1 and 2, the upper end of the word line 40 is formed lower than the upper end of the active region 12, thereby enlarging the contact region between the active region 12 and the lower electrode 50. However, even when the upper end of the word line 40 is formed at a substantially identical level to the upper end of the active region 12 as shown in FIG. 8, the active region 12 and the lower electrode 50 are still in contact with each other, thereby making the transistor properly operable. In case that the upper portion of the word line 40 material is recessed by the process shown in FIG. 3*n* using a CMP or an etch-back process, the second insulation film 34 also can be subject to an etch to be at a substantially same level as the recessed word line 40.

Figure 9:
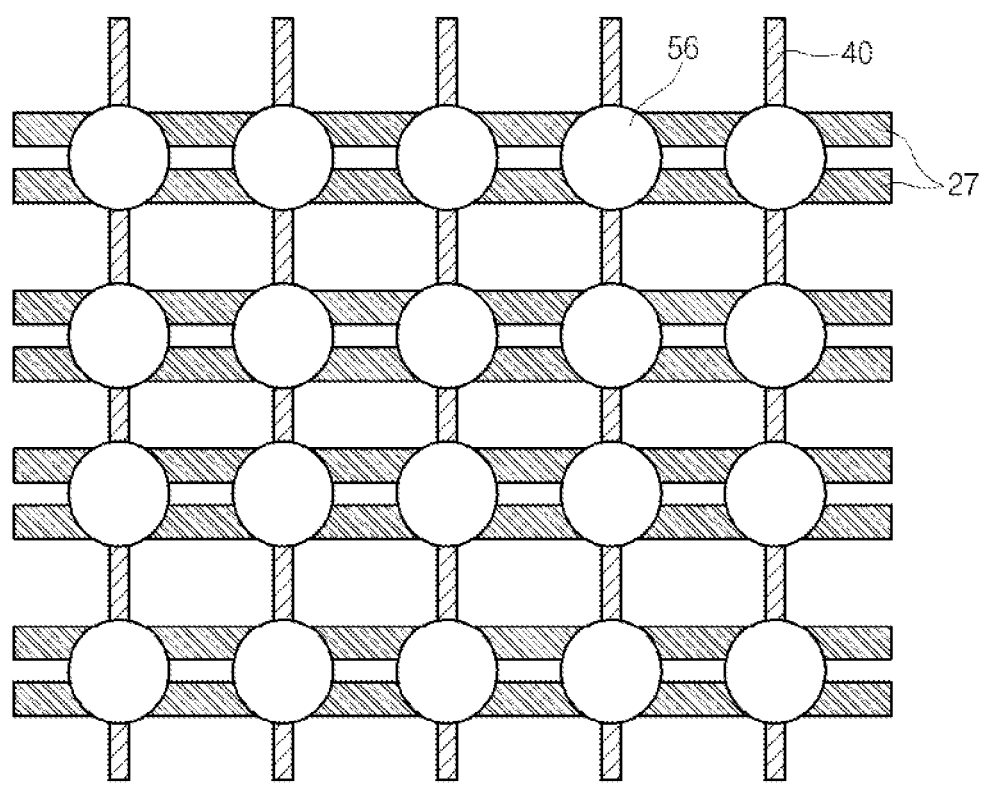
FIG. 9 is a plan view illustrating a semiconductor device including a vertical transistor according to an embodiment of the present invention.

FIG. 9 is a plan view illustrating a semiconductor device including a vertical transistor according to an embodiment of the present invention. Referring to FIG. 9, one word line 4 and two bit lines 27 are connected to one cell (i.e., one capacitor 56), such that a layout of 4F2 can be implemented in a manner that a transistor channel can be vertically formed.

Figure 10A:
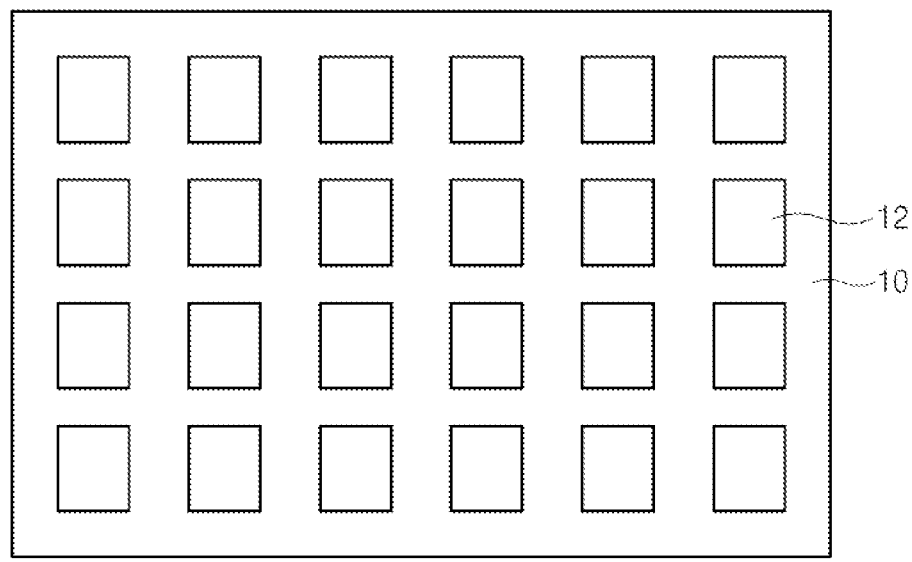
FIGS. 10a to 10d are plan views illustrating a method for forming a semiconductor device including a vertical transistor according to another embodiment of the present invention.
Figure 10B:
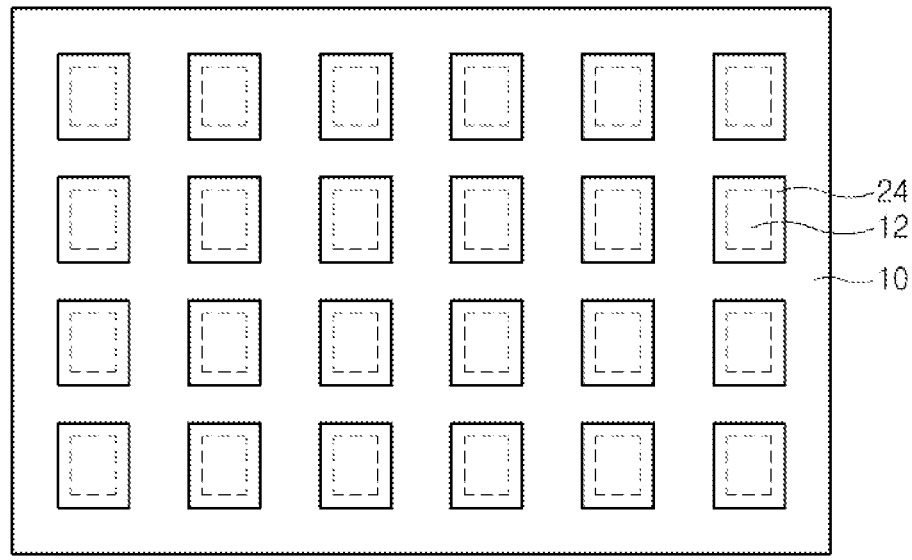
Figure 10C:
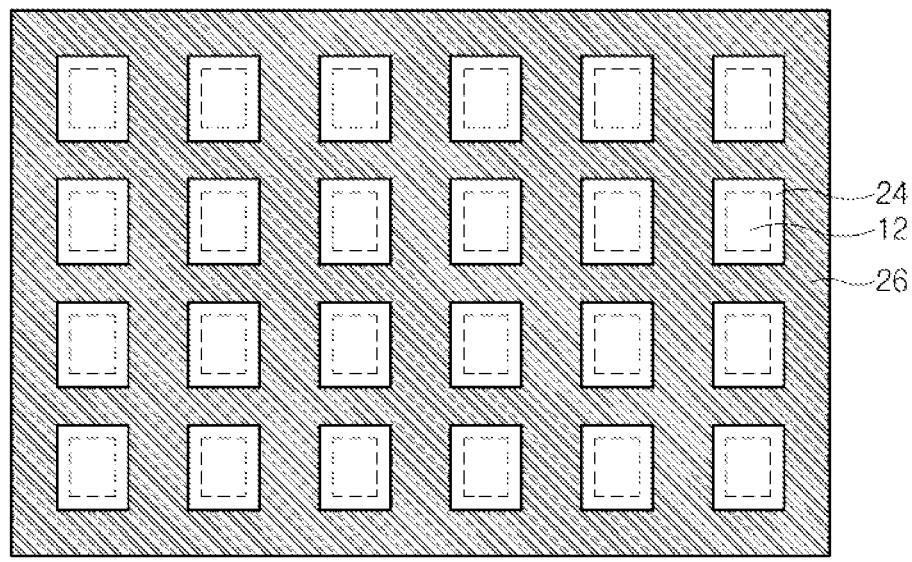
Figure 10D:
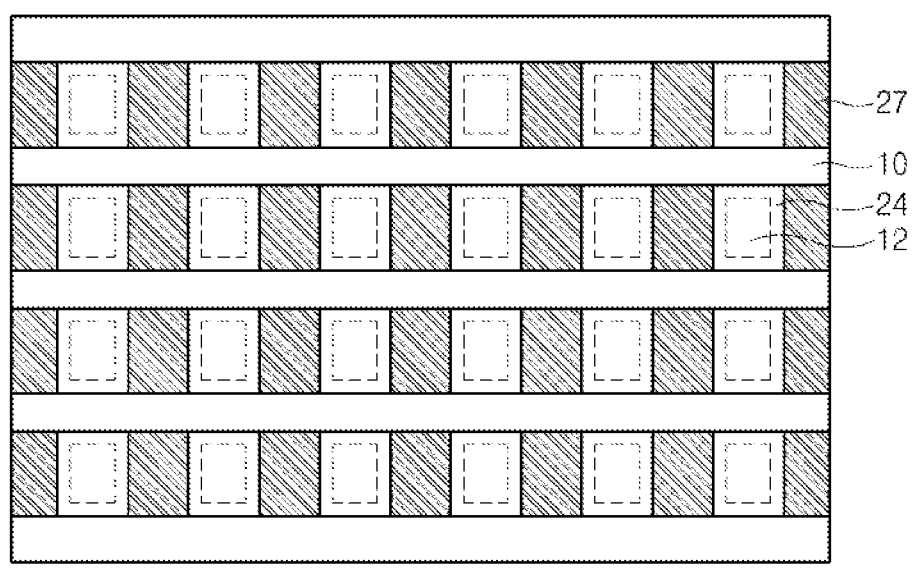

FIGS. 10*a* to 10*d* are plan views illustrating a method for forming a semiconductor device including a vertical transistor according to another embodiment of the present invention. A method for forming a semiconductor device in which the bit line 27 of FIG. 2 is formed to enclose the active region 12 is shown in FIGS. 10*a* to 10*d*. Referring to FIG. 10*a*, a plurality of active regions are formed over the semiconductor substrate 10. Referring to FIG. 10*b*, a bulb-type recess 24 is formed along the entire circumference of a lower portion of the active region 12. Although not shown in the drawings, the bulb-type recess 24 may be formed according to the order of FIGS. 3*a* to 3*i*, and the bulb-type recess 24 may be formed to enclose four sides of the active region 12 (in case that the active region is formed in a rectangular pillar shape) but not two sides thereof. Referring to FIG. 10*c*, a bit line material 26 is formed over the whole surface of the semiconductor substrate 10 in which the bulb-type recess 24 is formed. In this case, the bit line material 26 is also filled in the bulb-type recess 27 formed along a circumference of the lower portion of the active region 12. Referring to FIG. 10*d*, the bit line material 26 is etched using a mask extended along left and right sidewalls, so that the bit lines 27 are isolated from each other. As a result, the semiconductor device shown in FIG. 2, in which the bit line 27 is formed to enclose four sides of the active region 12 and extended to one direction, is formed.

Figure 11:
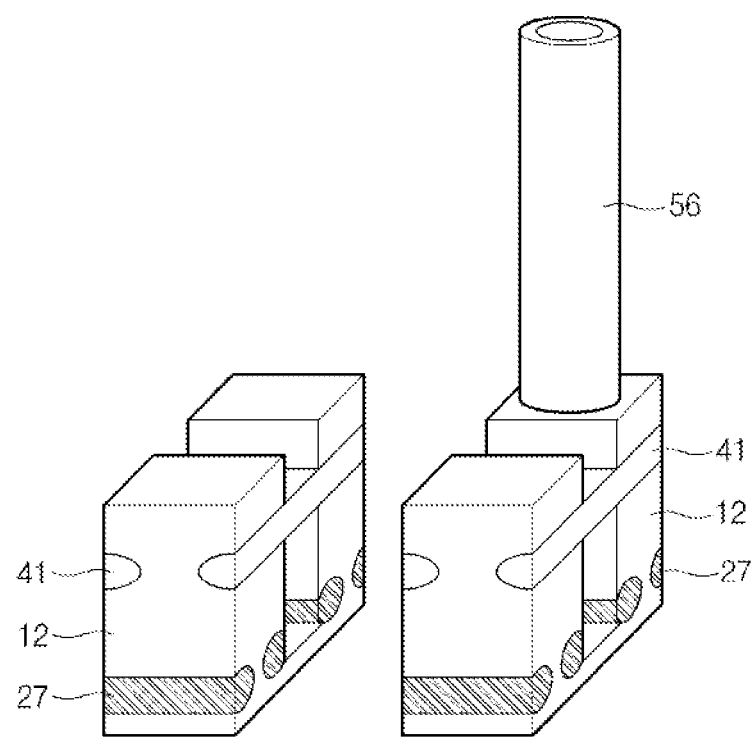
FIGS. 11 and 12 are perspective views illustrating a semiconductor device including a vertical transistor according to another embodiment of the present invention.
Figure 12:
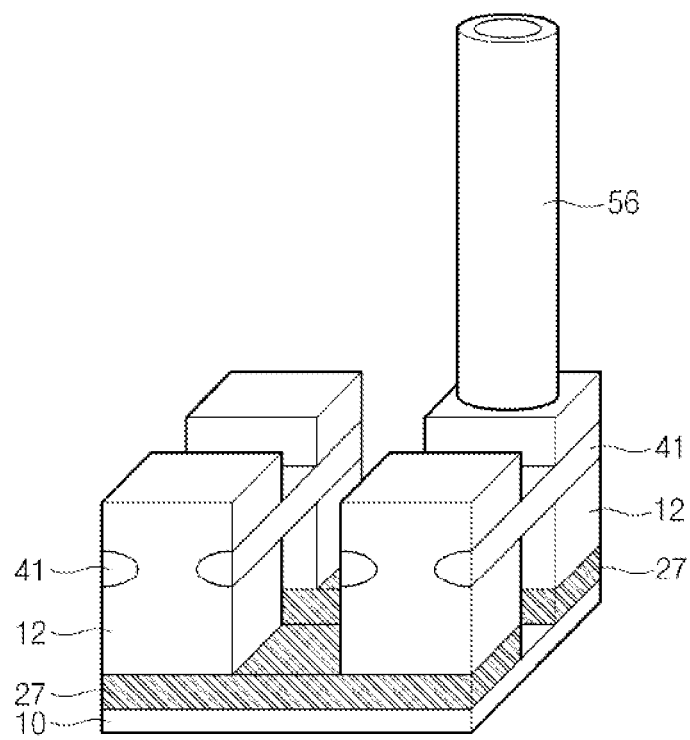

FIGS. 11 and 12 are perspective views illustrating a semiconductor device including a vertical transistor according to another embodiment of the present invention. Referring to FIGS. 11 and 12, not only the bit line 27 but also the word line 41 may be extended along both sidewalls of the active region 12 in the same manner as in the bit line 27. Similar to the bit line 27, the word line 41 may also be buried in the bulb-type recess formed in both sides of the active region 12.

As described above, if each of the word line 41 and the bit line 27 is formed as a bulb-type recess, the bit line 27 may be formed lower than the word line 41 because the word line 41 must be formed between the bit line 27 and the capacitor and the capacitor can be easily formed over the active region 12.

Two embodiments shown in FIGS. 11, 12 and 1 are all configured to have the recess for forming the word lines (40, 41) in the active region. In FIG. 1, a recess is formed in the center part of the active region 12. In FIG. 11, a (bulb-type) recess is formed at both sides of the active region 12. If a recess for word-line formation is formed at both sides of the active region 12 as shown in FIG. 11, a contact region between an upper portion of the active region 12 and a capacitor (or a storage node contact) is increased in size such that device characteristics can be improved.

Figure 13A:
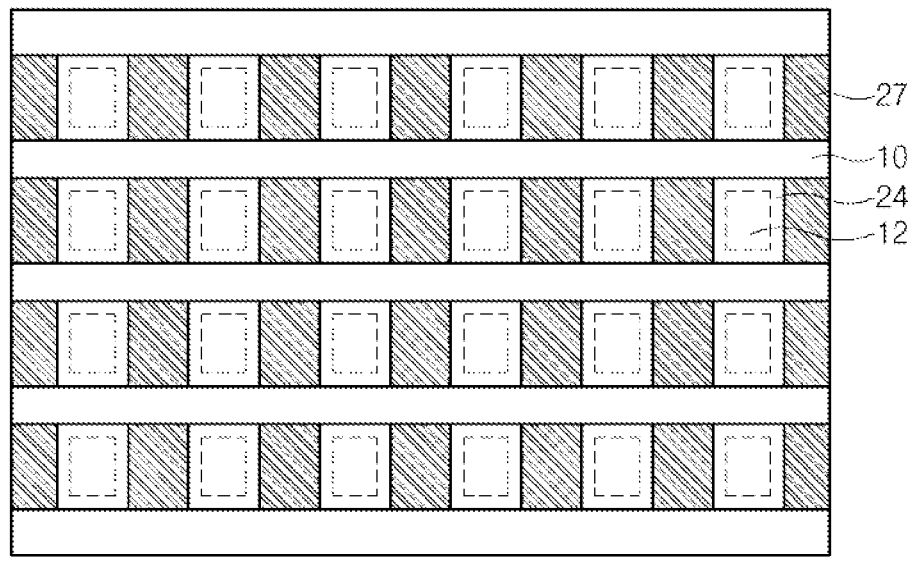
FIGS. 13a to 13c are plan views illustrating a semiconductor device including a vertical transistor according to another embodiment of the present invention.
Figure 13B:
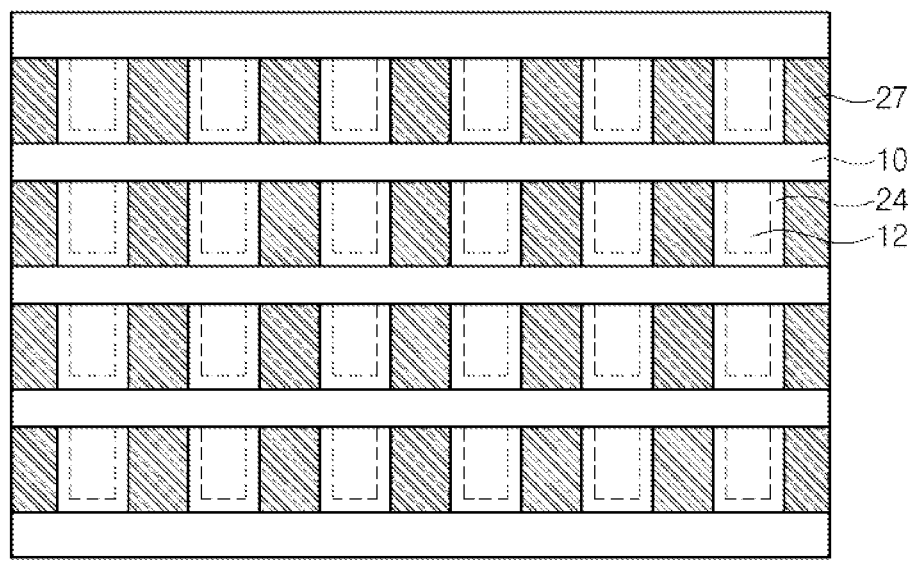
Figure 13C:
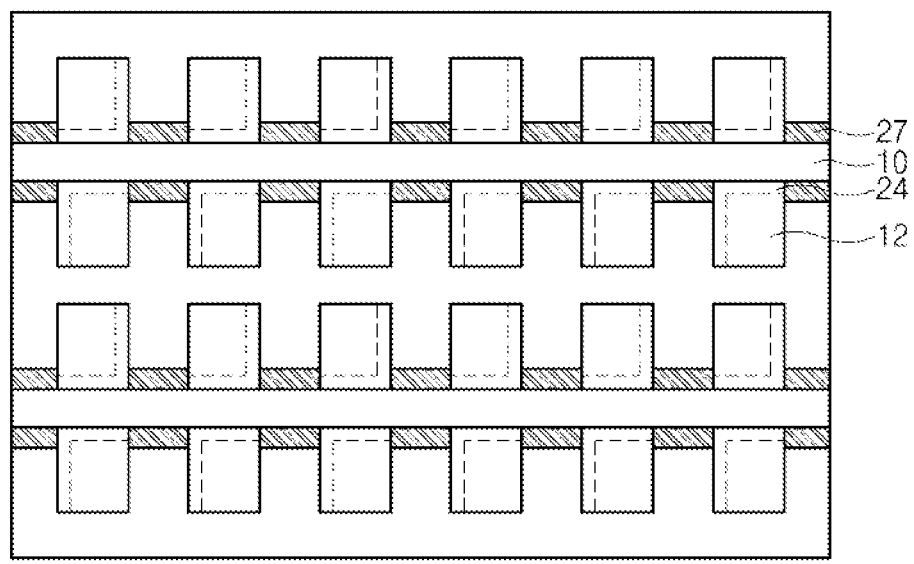

FIGS. 13*a* to 13*c* are plan views illustrating a semiconductor device including a vertical transistor according to another embodiment of the present invention. FIG. 13*a* (same as FIG. 10*d*) is a plan view illustrating a semiconductor device in which a bulb-type recess 24 for forming the bit line 27 is formed at four sides (all sides) of the active region 12, and FIGS. 13b and 13c are plan views illustrating a semiconductor device in which the bulb-type recess 24 is formed not only at three sides or two neighbor sides. If the active region 12 is formed not in a rectangular shape but in a cylindrical shape, a bulb-type recess 24 may be formed, for example, at the entire surface, at a surface corresponding to ¾ of the entire surface, or at a surface corresponding to ²⁄₄ of the entire surface. As described above, although the bulb-type recess 24 an the bit line 27 are formed at two or three sides from among four sides, resistance between the bit line 27 and the active region 12 can be more greatly reduced as compared to the convention semiconductor device.

As is apparent from the above description, a semiconductor device and a method for forming the same according to the embodiments of the present invention can reduce a cell area, resulting in simplified fabrication process.

In addition, the method for forming the semiconductor device can guarantee a drive current by increasing a contact region between a bit line and an active region.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device including a vertical transistor, the device comprising:
    an active pillar vertically protruded from a semiconductor substrate;
    a first recess formed at both sidewalls of a lower portion of the active pillar;
    a bit line buried in the first recess;
    a second recess formed over the first recess in the active pillar; and
    a word line formed to cross the bit line, and buried in the second recess.

2. The semiconductor device according to claim 1, wherein the second recess is located at a center part or one sidewall of the active region.

3. The semiconductor device according to claim 1, wherein the second recess has a cross-sectional shape that is a rectangular shape or an oval shape.

4. The semiconductor device according to claim 1, wherein a top surface of the word line is located lower than a top surface of the active pillar.

5. The semiconductor device according to claim 1, further comprising:
    a protective film disposed between the active pillar and the word line.

6. The semiconductor device according to claim 1, further comprising:
    an insulation film formed over the word line.

7. The semiconductor device according to claim 1, wherein the first recess is formed to enclose the active pillar.

8. The semiconductor device according to claim 1, wherein the bit line is formed over the semiconductor substrate at a position between the active pillar and a different active pillar adjacent to the active pillar.

9. The semiconductor device according to claim 1, wherein the bit line includes a metal or ion implantation region.

10. The semiconductor device according to claim 1, wherein the active pillar is formed in a rectangular pillar shape or in a cylindrical column shape.

* * * * *